United States Patent [19]

Hattori et al.

[11] 4,075,516
[45] Feb. 21, 1978

[54] DIFFRACTION ELECTROACOUSTIC TRANSDUCER

[75] Inventors: Shuzo Hattori; Tadao Hiramatsu, both of Nagoya, Japan

[73] Assignee: Hagiwara Denki Kabushiki Kaisha, Nagoya, Japan

[21] Appl. No.: 688,358

[22] Filed: May 20, 1976

[30] Foreign Application Priority Data

May 21, 1975 Japan .................................. 50-61209

[51] Int. Cl.² ............................................. H01L 41/04
[52] U.S. Cl. ..................................... 310/334; 310/366; 310/369; 333/30 R; 350/96.10
[58] Field of Search ................... 310/8.1, 9.8, 9.7, 8.3; 333/39 R, 72; 350/161 R, 96 WG

[56] References Cited

U.S. PATENT DOCUMENTS

| 3,300,739 | 1/1967 | Mortley | 333/30 R |
| 3,343,105 | 9/1967 | Van Der Pauw | 333/30 |
| 3,369,199 | 2/1968 | Sittig | 310/9.8 X |
| 3,401,360 | 9/1968 | Schulz-Du Bois | 310/9.8 X |
| 3,518,582 | 6/1970 | Pizzarello et al. | 310/8.1 X |
| 3,573,669 | 4/1971 | Papadakis | 310/8.3 X |
| 3,804,489 | 4/1974 | Li et al. | 350/96 WG |
| 3,914,717 | 10/1975 | Rosenberg et al. | 310/8.3 X |
| 3,958,862 | 5/1976 | Victor et al. | 350/160 R |

*Primary Examiner*—Mark O. Budd
*Attorney, Agent, or Firm*—Berman, Aisenberg & Platt

[57] ABSTRACT

In a bulk piezoelectric crystal an arbitrary wavefront of an acoustic wave is reconstructed from an array of wavelets generated subjacent a set of interdigital electrodes on a surface of the crystal.

4 Claims, 6 Drawing Figures

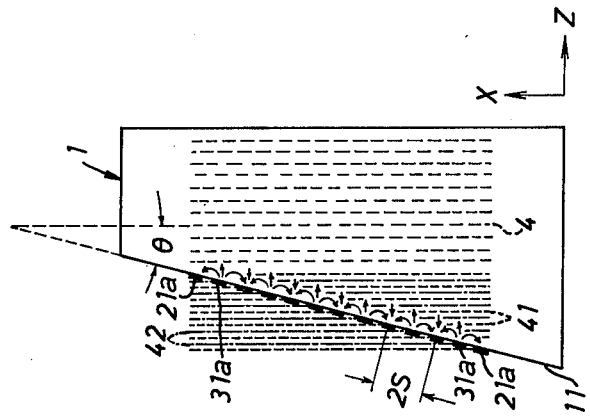
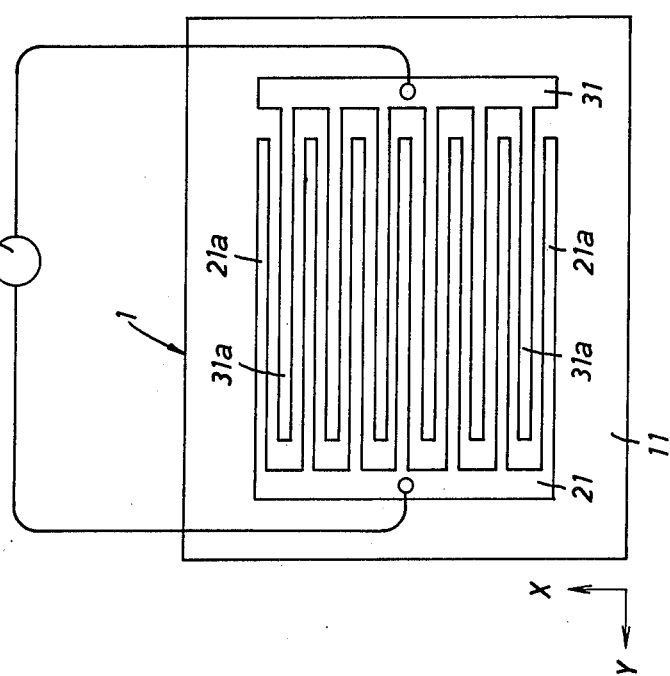

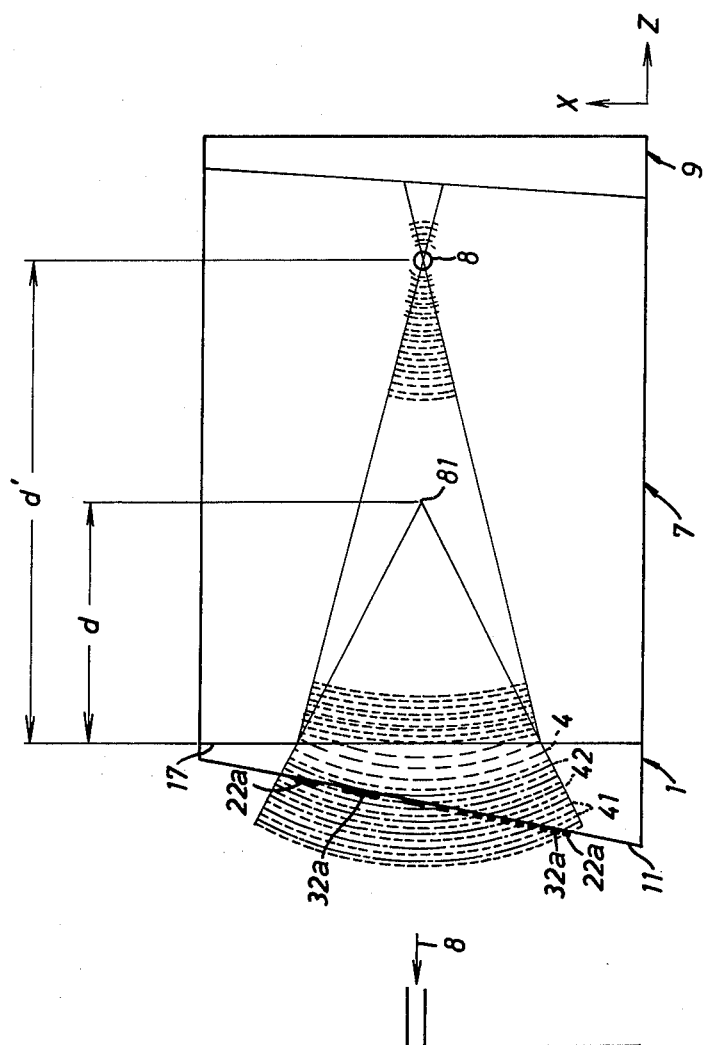
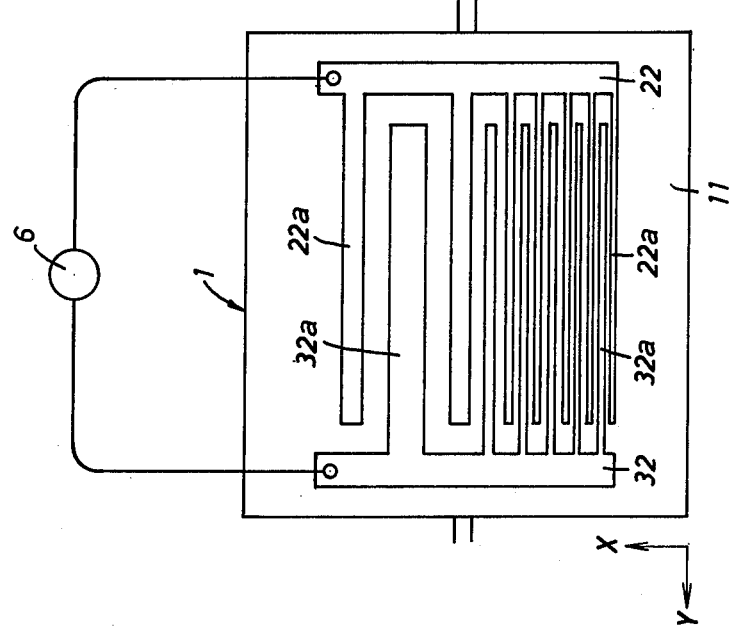

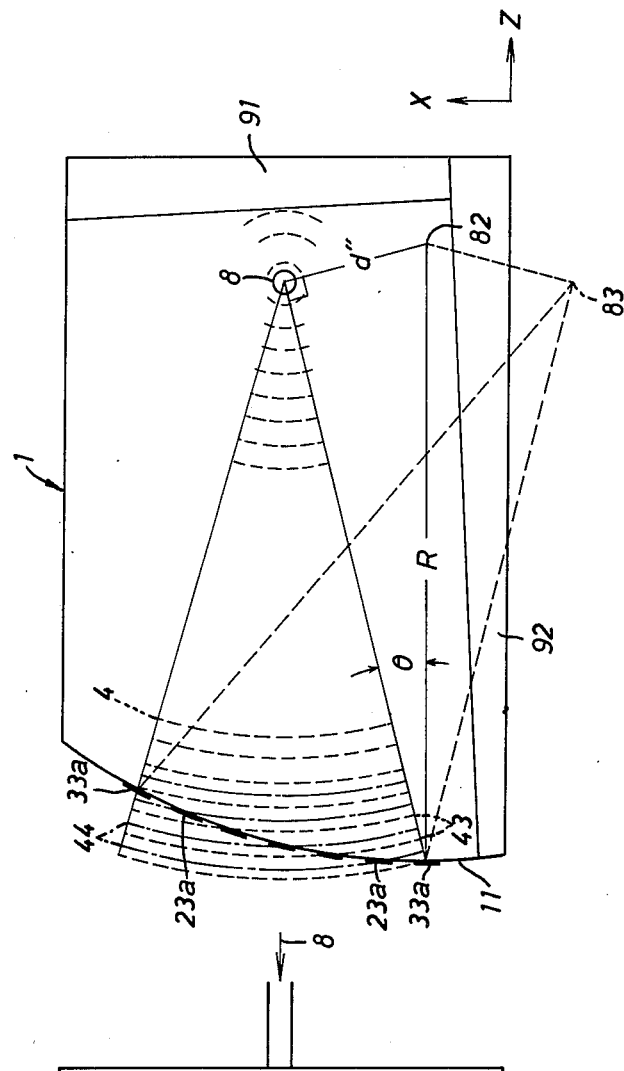
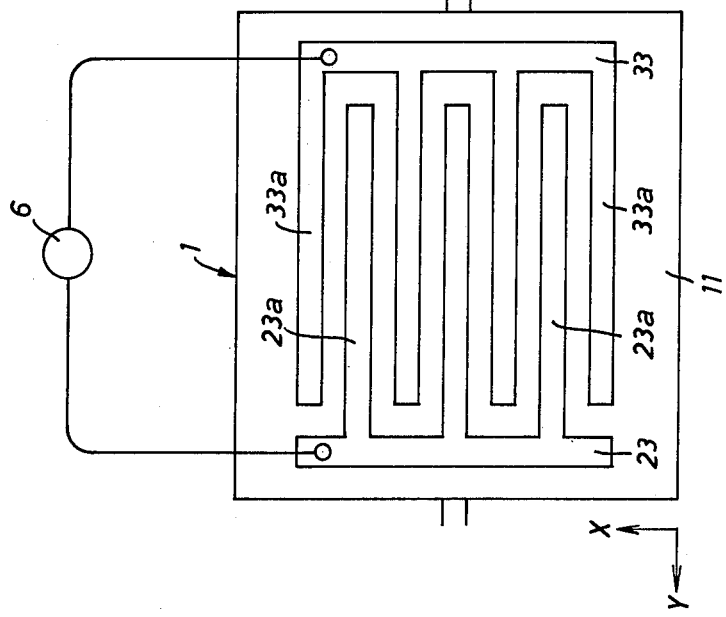

DIFFRACTION ELECTROACOUSTIC TRANSDUCER

BACKGROUND OF THE INVENTION

The present invention relates to electroacoustic transducers, and more particularly to a diffraction electroacoustic transducer useful as an acoustooptic deflector, modulator or the like to generate a supersonic wave having a variable wideband frequency or a very short pulsed waveform.

A conventional wideband transducer has the shape of a thin plate with metal electrodes plated on both sides thereof. To ensure a flat frequency response over a wide frequency range, any acoustic resonance in the frequency range of interest should be avoided. Principal acoustic resonances occur at every integral multiple of the frequency $f_c$ which is expressed as $$f_c = v_a/(2D), \tag{1}$$

in terms of the acoustic wave-velocity $v_a$ along a direction perpendicular to the thin plate and the thickness $D$ of the plate.

When the transducer is bonded to an acoustooptic material having an acoustic impedance perfectly matched with that of the transducer material, acoustic resonance can be avoided. However, the electroacoustic conversion efficiency of the transducer is greatly reduced when the transducer is used over a frequency range of several multiples of the frequency $f_c$. Therefore, the frequency $f_c$ is a kind of measure of the practical limit of the frequency band for thin plate type transducers. For a typical value of $v_a$, $6 \times 10^3$ m/sec, the thickness $D$ of the thin plate must be less than 30 micrometers for a transducer having a band-width of a hundred megahertz.

Thus, extensive efforts have been made in the fabrication of thin transducers. For instance, a transducer fabricated to 3 micrometers using a spattering erosion technique is reported by J. D. Larson, III and D. K. Winslow in an article entitled "Ultrasonically Welded Piezoelectric Transducers," which appeared in IEEE Transactions on Sonics and Ultrasonics, vol. SU-18, No. 3, pp. 142–152, July 1971. The reported transducer has seemed to be the practical limit of those thin plate type of transducers.

On the other hand, to generate a surface acoustic wave, the so-called "interdigital transducer" has been proposed by J. H. Coquin and H. F. Tiersten, and a transducer usable up to 1.7 gigahertz has been achieved by A. N. Boers et al. as reviewed by Ernest Stern in an article entitled "Microsound Components, Circuits and Applications" which appeared in IEEE Transaction on Microwave Theory and Techniques, vol. MTT-17, No. 10, pp 835–844, November 1969. The interdigital transducer comprises a set of parallel metal strips plated on a piezoelectric material and alternately connected to each opposite terminal of the transducer. The interdigital transducer has a maximum efficiency around the frequency $f_o$ which satisfies the relation, $$f_o = v_a/(2S), \tag{2}$$

given in terms of the spacing $S$ between two adjacent metal strips. An interdigital surface electrode having a spacing S of a few micrometers is easily made by photolithographic technology developed in recent years.

Equation (2) may be interpreted as a kind of wave matching condition, $$K_a = (2\pi f_o) / v_a = \pi/S, \tag{3}$$

between the wave vector $K_a$ of the surface acoustic wave and the wave vector $\pi/S$ of the spatially periodic change in the electric field having a period 2S. An analogous wave matching excitation of a volume acoustic wave is discussed by G. A. Coquin et al. in a paper entitled "Wide Band Acoustooptic Deflectors Using Acoustic Beam Steering" which appeared in IEEE Transactions on Sonics and Ultrasonics, vol. SU-17, No. 1, pp. 34–40, January 1970. In this case the wave matching condition is discussed merely in connection with an effective acoustic wavefront in an array of beams of acoustic waves, each of which is excited by each separate transducer of the thin plate type. Each adjacent transducer is mounted on each stepped surface of depth $s$ and height $h$, excited with a phase angle shifted $\pi$-radians from each other. The inclination $\theta_e$ of the average wavefront over the array of beams measured from the plane of each transducer satisfies the condition, $$\pi S \simeq K_a [(h/s) - \theta_e]. \tag{3'}$$

Equation (3) and Equation (3') are special and approximate expressions of a more general wave matching condition, $$m(\pi/S) = K_a(\sin\theta_i - \sin\theta_e), \tag{3''}$$

which is applied to the diffraction of a wave having a wave-number $K_a$, an angle of incidence $\theta_i$ and an angle of diffraction $\theta_e$ by a structure having a period 2S.

SUMMARY OF THE INVENTION

The present invention is based on a finding that in a bulk piezoelectric crystal an arbitrary wavefront of an acoustic wave may be reconstructed from an array of wavelets generated subjacent a set of interdigital electrodes on a surface of the crystal. The principle of reconstruction may be deduced from a general diffraction theory that holds for all kinds of wave phenomena.

In the case of equidistant interdigital electrodes of spacing S on a plane surface, a plane acoustic wave of wave-number $K_a$ propagating along a direction inclined at an angle $\theta$ from the normal of the plane is generated when the condition, $$m(\pi/S) = K_a \sin \theta, \tag{4}$$

is satisfied. There is no need for separate transducers of the thin plate type nor any need for delicate fabrication technology. The structure and the accompanying technique of this interdigital electrode diffraction transducer is far simpler than conventional transducers in view of recent technology regarding photolithography.

Thus, the present invention discloses a transducer usable for a frequency over 1 gigahertz. The concept of the diffraction transducer is easily adapted for a non-planar surface of a piezoelectric crystal and for a non-planar wavefront to be reconstructed.

According to the present invention, from a pre-specified wavefront that creates the desired acoustic field, a first set of equi-phase surfaces is obtained as a reference phase along the pre-specified wavefront and a second set of equi-phase surfaces is obtained with a phase that is shifted $\pi$-radian from the first set of surfaces, respectively. Thus, along the set of intersecting lines between the first set of equi-phase surfaces and a given surface of the piezoelectric crystal, a first set of metal strips is plated on the given surface of the crystal, then the metal strips are connected together to form a first electrode. Along the set of intersecting lines between the second set of equi-phase surfaces and the given surface of the piezoelectric crystal, a second set of metal strips is plated on the given surface of the crystal, then such metal strips are connected together to form a second electrode.

In the preferred embodiments of the present invention, a plane wavefront is reconstructed from wavelets generated by a set of interdigital electrodes on a plane surface of a piezoelectric crystal, a cylindrical wavefront is reconstructed from wavelets generated by a set of interdigital electrodes on a plane surface of a piezoelectric crystal, and further a cylindrical wavefront is reconstructed from wavelets generated by a set of interdigital electrodes on a cylindrical surface of a piezoelectric crystal with its axis parallel to that of the cylindrical wavefront.

BRIEF DESCRIPTION OF THE DRAWINGS

Other objects and advantages of the present invention will become apparent from the following detailed description, reference being had to the accompanying drawings of which:

FIG. 1 is a plane view of a first embodiment of an electroacoustic transducer according to the present invention, in which a plane wave is reconstructed from wavelets generated by interdigital electrodes on a plane surface;

FIG. 2 shows a vertical cross-section of the electroacoustic transducer of FIG. 1;

FIG. 3 is a plan view of a second embodiment of an electroacoustic transducer according to the present invention, in which a cylindrical wave is reconstructed from wavelets generated by interdigital electrodes on a plane surface, the cylindrical wave being used for deflecting a light beam;

FIG. 4 shows a vertical cross-section of the electroacoustic transducer of FIG. 3;

FIG. 5 is a plan view of a third embodiment of an electroacoustic transducer according to the present invention, in which a cylindrical wave is reconstructed from wavelets generated by interdigital electrodes on a cylindrical surface, the cylindrical wave being used for deflecting a light beam; and FIG. 6 shows a vertical cross-section of the electroacoustic transducer of FIG. 5.

DESCRIPTION OF THE PREFERRED EMBODIMENTS

Referring now to the drawings, particularly to FIGS. 1 and 2, a first embodiment of an electroacoustic transducer according to the present invention, in which a plane wave is reconstructed from wavelets generated from interdigital electrodes on a plane surface of a piezoelectric crystal, will now be explained.

On a piezoelectric lithium niobate crystal 1, a plane surface 11 with a normal inclined at an angle $\theta$ from the z-axis of the crystal 1 towards the x-axis is chosen as the surface to be electroded. To obtain a plane wavefront normal to the z-axis, a first set of equi-phase planes 41 are depicted parallel to a pre-specified plane wavefront 4 that is normal to the z-axis. The equi-phase planes 41 are spaced by $2\pi/K_a$ from each other. Along every intersecting line between the plane surface 11 and the equi-phase planes 41, which are all parallel to the y-axis and are spaced by $2S$, a metal strip 21a is plated on the plane surface 11, and the plurality of metal strips thus formed are connected with each other to form a first electrode 21. In this instance, $S$, $K_a$ and $\theta$ satisfy the aforementioned Equation (4) with $m = 1$. Between the equi-phase planes 41, is a second set of equi-phase planes 42 with a phase angle $\pi$ shifted from that of the equi-phase planes 41. Along all intersecting lines between the plane surface 11 and the second set of equi-phase planes 42, another plurality of metal strips 31a are plated on the plane surface 11 and are connected with each other to form a second electrode 31.

To use the electroacoustic transducer described above, an AC voltage of a frequency $f_a$ is applied to the interdigital electrodes 21 and 31 from an AC voltage source 6 to create an electric field having a z-component of the field with a period $2S$. As seen clearly in FIG. 2, all cylindrical wavelets are generated from the z-component of the local electric field and have the same phase when they reach the pre-specified wavefront 4, because the distances from each branch of the electrodes 21 and 31 to the wavefront 4 are integral multiples of the acoustic wavelength $2\pi/K_a$.

When the frequency $f_a$ is changed, the direction of the wavefront may be steered according to the aforementioned Equation (3) and (4). This steering of the direction of the wavefront 4 is useful to obtain wideband matching to the exact Bragg condition for deflection of an optical beam.

FIGS. 3 and 4 illustrate a second embodiment of the present invention, in which a cylindrical wave is reconstructed from wavelets generated from interdigital electrodes on a plane surface of a piezoelectric crystal, the cylindrical wave being used for deflecting a light beam.

In this embodiment, a piezoelectric lithium niobate crystal 1 having a z-propagating longitudinal wave-velocity $v_a$ of $7.33 \times 10^3$ m/sec is bonded to an acoustooptic lead molibdate crystal 7 having a z-propagating longitudinal wave-velocity $v_a'$ of $3.66 \times 10^3$ m/sec, each of the crystals 1 and 7 being parallel to the z-axis. A light beam 8 to be deflected enters the acoustooptic crystal 7 along the y-direction in a straight line. In this case a pre-specified cylindrical wavefront 4 converging to the light beam 8 is desired to be reconstructed. If the character $d'$ denotes the distance of the light beam 8 from the border 17 between the piezoelectric crystal 1 and the acoustooptic crystal 7, the distance $d$ between the axis 81 of the pre-specified cylindrical wavefront 4 inside the piezoelectric crystal 1 and the border 17 is determined by the minimum refraction of the wave as $$d = (v_a'/v_a)d' \tag{5}$$

In FIG. 4, a first set of equi-phase cylindrical surfaces 41 is shown by dotted lines and a second set of equi-phase cylindrical surfaces 42 having a phase angle $\pi$ shifted from the first set of equi-phase surfaces 41, is shown by dot and dash lines. Along all intersecting lines between the plane surface 11 of the piezoelectric crystal 1 and the first set of equi-phase surfaces 41, a plurality of metal strips 22a are plated on the plane surface 11 parallel to the y-axis and are connected with each other to form a first electrode 22. Along all intersecting lines between the plane surface 11 of the crystal 1 and the second set of equi-phase surfaces 42, a plurality of metal strips 32a are plated on the plane surface 11 and are connected with each other to form a second electrode 32. The strips of each electrode thus patterned have the properties of a one dimensional Fresnel pattern. Furthermore, in this embodiment an acoustic absorber 9 serves to prevent waves from being being reflected from various surfaces of the crystal 7 so as to eliminate undesired standing waves inside the crystal 7.

This second embodiment while useful for obtaining high acoustic field at the position of the light beam, is however not very favorable for wideband deflection because the position where a high acoustic field is formed will move as a consequence of wavefront steering.

In FIGS. 5 and 6, there is disclosed a third embodiment of the present invention, in which a cylindrical wave is reconstructed from wavelets generated by interdigital electrodes on a cylindrical surface of a piezoelectric crystal, the cylindrical wave being used for deflecting a light beam.

In this embodiment, a piezoelectric lithium niobate crystal 1 is also used as an acoustooptic crystal. A pre-specified cylindrical wavefront 4 converging to the light beam 8 is desired to be reconstructed. The crystal 1 has a cylindrical surface 11 with an axis 82 parallel to the y-axis and positioned at a distance $d''$ from the light beam 8. The radius R of the cylindrical surface 11 satisfies a relation $$R \times \sin \theta = d'' \tag{6}$$

A first set 43 and a second set 44 of equi-phase cylindrical surfaces, with a mutual-phase shifted of $\pi$ radians are depicted by dotted lines and dot and dash lines respectively. A first set 23a and a second set 33a of metal strips are plated on the cylindrical surface 11 along all intersecting lines between the first set 43 and the second set 44 of equi-phase surfaces and the cylindrical surface 11, respectively. The first and the second set of metal strips are connected together within each set to form a set of interdigital electrodes 23 and 33. Thus, in the interdigital electrodes, the metal strips have approximately equal spacing S between each other as given by Equation (4) with $\theta$ given by Equation (6).

Furthermore, in this third embodiment two acoustic absorbers 91 and 92 serve to prevent waves from being reflected from various surfaces of the crystal 1. Wavelets generated by the interdigital electrodes 23 and 33 also reconstruct a spurious cylindrical wave which converges to an axis 83 located at the symmetrical position of light beam 8 with respect to the axis 82. The acoustic absorber 92 is especially designed to prevent possible disturbance from the spurious cylindrical wave. Therefore, this embodiment provides a simpler way of obtaining a focused acoustic field at the position of the light beam than that of the second embodiment.

Although certain specific embodiments of the invention have been shown and described, it is obvious that many modifications thereof are possible. The invention, therefore, is not intended to be restricted to the exact showing of the drawings and description thereof, but is considered to include reasonable and obvious equivalents.

What is claimed is:

1. A diffraction electroacoustic transducer comprising:
    a piezoelectric crystal;
    a set of interdigital electrodes including a first plurality of metal strips and a second plurality of metal strips both provided on one surface of said crystal for producing an acoustic volume wave of a desired acoustic field within said crystal; and
    means for applying an AC voltage to said interdigital electrodes;
    said first plurality of metal strips of said interdigital electrodes positioned substantially along a first set of lines defined by the intersection of said one surface and a first set of equi-phase surfaces along a pre-specified wavefront defining the desired acoustic field; and said second plurality of metal strips of said interdigital electrodes positioned substantially along a second set of lines defined by the intersection of said one surface and a second set of equi-phase surfaces shifted $\pi$ radians from said first set of equi-phase surfaces.

2. A diffraction electroacoustic transducer comprising:
    a piezoelectric crystal having a plane surface;
    a set of interdigital electrodes including a first plurality of metal strips and a second plurality of metal strips both provided on said plane surface of said crystal for producing an acoustic volume wave of a desired uniform acoustic field within said crystal; and
    means for applying an AC voltage to said interdigital electrodes;
    said first plurality of metal strips of said interdigital electrodes positioned substantially along a first set of lines defined by the intersection of said plane surface and a first set of equi-phase planes along a prespecified plane wavefront defining the desired uniform acoustic field; and said second plurality of metal strips of said interdigital electrodes positioned substantially along a second set of lines defined by the intersection of said plane surface and a second set of equi-phase planes shifted $\pi$ radians from said first set of equi-phase planes.

3. A diffraction electroacoustic transducer comprising:
    a piezoelectric crystal having a plane surface;
    a set of interdigital electrodes including a first plurality of metal strips and a second plurality of metal strips both provided on said plane surface of said crystal for producing an acoustic volume wave of a desired acoustic field focusing on a straight line within said crystal; and
    means for applying an AC voltage to said interdigital electrodes;
    said first plurality of metal strips of said interdigital electrodes positioned substantially along a first set of lines defined by the intersection of said plane surface and a first set of equi-phase cylindrical surfaces along a pre-specified cylindrical wavefront defining the desired acoustic field; and said second plurality of metal strips of said interdigital electrodes positioned substantially along a second set of lines defined by the intersection of said plane surface and a second set of equi-phase cylindrical surfaces shifted $\pi$ radians from said first set of equi-phase cylindrical surfaces.

4. A diffraction electroacoustic transducer comprising:
    a piezoelectric crystal having a cylindrical surface;
    a set of interdigital electrodes including a first plurality of metal strips and a second plurality of metal strips both provided on said cylindrical surface of said crystal for producing an acoustic volume wave of a desired acoustic field focusing on a straight line within said crystal; and means for applying a voltage of said interdigital electrodes;

said first plurality of metal strips of said interdigital electrodes positioned substantially along a first set of lines defined by the intersection of said cylindrical surface of said crystal and a first set of equi-phase clyindrical surfaces along a pre-specified cylindrical wavefront defining the desired acoustic field; and said second plurality of metal strips of said interdigital electrodes positioned substantially along a second set of lines defined by the intersection of said clyindrical surface of said crystal and a second set of equi-phase clyindrical surfaces shifted $\pi$-radians from said first set of equi-phase cylindrical surfaces.

* * * * *